(12) United States Patent
Chin et al.

(10) Patent No.: US 7,878,814 B2
(45) Date of Patent: Feb. 1, 2011

(54) ELECTRICALLY CONDUCTIVE BEARING RETAINERS

(75) Inventors: Patricia D. Chin, Redondo Beach, CA (US); Daniel P. Brown, Long Beach, CA (US); James D. Strayer, Huntington Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/411,168

(22) Filed: Mar. 25, 2009

(65) Prior Publication Data

US 2009/0181554 A1  Jul. 16, 2009

Related U.S. Application Data

(63) Continuation-in-part of application No. PCT/US2007/015488, filed on Jul. 5, 2007.

(60) Provisional application No. 60/830,591, filed on Jul. 13, 2006.

(51) Int. Cl.
  *H01R 39/00* (2006.01)
(52) U.S. Cl. .......................... 439/17; 174/367
(58) Field of Classification Search ............ 439/17, 439/27; 174/367, 368, 369
  See application file for complete search history.

(56) References Cited

U.S. PATENT DOCUMENTS 3,055,969 A * 9/1962 Schaller, Jr .................. 174/369
4,684,180 A   8/1987 Bigham et al.
4,904,190 A * 2/1990 Plocek et al. ................ 439/15
5,173,053 A * 12/1992 Swanson et al. ............. 439/27
5,690,498 A * 11/1997 Sobhani ....................... 439/22
5,860,819 A   1/1999 Northey et al.
6,612,847 B2 * 9/2003 Canizales, Jr. .............. 439/17
6,979,200 B2 * 12/2005 Ritchie ........................ 439/15

FOREIGN PATENT DOCUMENTS

DE  10110067 A1  9/2002

OTHER PUBLICATIONS

International Search Report & Written Opinion dated Apr. 23, 2010 of PCT/US2010/021745 filed Jan. 22, 2010 (12 pages).

* cited by examiner

*Primary Examiner*—Thanh-Tam T Le
(74) *Attorney, Agent, or Firm*—Pillsbury Winthrop Shaw Pittman LLP

(57) ABSTRACT

Electrically conductive bearing retainers create an electrical path between the static and dynamic sides of a rotating joint to block EMI radiation from entering or leaving a system. Concentric annular inner and outer bearing retainers with an array of conductive contact members therebetween are installed in contact with the inner and outer races of a dynamic bearing interface. Each contact member includes a base and tips. The outer bearing retainer ring has a recess for mounting a contact member and a notch for positioning the contact member tips to make contact with the inner bearing retainer ring. The inner bearing retainer ring includes a conductive contact surface. The contact member tips contact the conductive contact surface to create a dynamic shield between an inner bearing race and an outer bearing race.

19 Claims, 7 Drawing Sheets

ELECTRICALLY CONDUCTIVE BEARING RETAINERS

CROSS-REFERENCE TO RELATED APPLICATION

This application is a continuation-in-part of U.S. PCT Application Ser. No. PCT/US07/15488 filed Jul. 5, 2007, which claims the benefit of U.S. application Ser. No. 11/825,232 filed Jul. 5, 2007 and U.S. Provisional Application Ser. No. 60/830,591 filed Jul. 13, 2006, the entire contents of each of which are incorporated herein by reference.

GOVERNMENT RIGHTS

This invention was made with U.S. Government support under U.S. Government Contract USZA95-03-D-0011 awarded by the U.S. Army. The U.S. Government has certain rights in this invention.

BACKGROUND OF THE INVENTION

The present invention relates to electrical and electronic components. More particularly, it is concerned with electrically conductive bearing retainers.

Bearing retainers are used to separate and position the bearings that support motor driven joints in apparatus such as turret systems for airborne, ground and sea based platforms. These turret assemblies may hang on/under a variety of operational platforms, including but not limited to, helicopters, unmanned aerial vehicles, fixed wing aircraft, ground and marine vehicles and the like.

The turret assemblies may employ gimbals consisting of two rotating components (azimuth and elevation) to accurately distinguish, track, and eliminate targets. The dynamic azimuth and elevation interfaces are bearing supported, motor driven joints that contain dynamic environmental seals. These dynamic interfaces may have very high resistances because ball bearing contact is minimal between the inner and outer races of the bearing. The motors are often powered with high frequency voltages that can generate extremely strong electromagnetic interference radiation (EMI) emissions. The lack of conductivity between these dynamic interfaces allows EMI emissions to radiate from the system instead of grounding to the chassis or helicopter.

EMI is electromagnetic radiation emitted by electrical circuits carrying rapidly changing signals, as a by-product of their normal operation. EMI causes unwanted signals (interference or noise) to be induced in other circuits. These interferences can interrupt, obstruct or otherwise degrade or limit the effective performance of the other circuits. EMI can be induced intentionally, as in some forms of external electronic warfare or unintentionally as a result of spurious emissions and the like. EMI emissions can cause severe operational platform complications such as flight, guidance, and weapon control interference. In addition, any system having large EMI emissions can be detected easily and tracked by enemy forces.

Electrical resistance "R", measured in ohms $\Omega$, is a measure of the degree to which an object opposes the passage of an electric current. Materials with high resistance values are considered to be poor conductors of electricity, while materials having low resistance values are considered to be good conductors. In previous turret systems, electrical resistances of between about $1\Omega$ and about $4\Omega$ were considered to be acceptable. Under current standards, the acceptable electrical resistance values have decreased by about 1600 fold and must be below about 2.5 milliohms to meet customer/program requirements.

Complex turret systems may contain numerous electrical components that can generate EMI emissions. As the sophistication of these turret assemblies continues to develop with advances in technology and war-fighting capabilities, EMI issues are continuously on the rise. A Faraday cage may be employed to suppress both internally generated and externally induced EMI. A Faraday cage, often simply referred to as a shield, is an enclosure formed of a conductive material and designed to exclude electromagnetic fields in an application of Gauss' law. Gauss' law describes the distribution of electrical charge on an electrically conductive form, such as a sphere, plane, torus, or gimbal etc. Since like charges repel each other, the charge will 'migrate' to the surface of the conducting form. A Faraday cage volume can be created by adding a network of conductive contacts between rotating gimbal interfaces. As internally generated EMI approaches the inside wall of the gimbal Faraday cage volume, charge will be absorbed and transferred back to the chassis ground. This absorption eliminates EMI emissions which would otherwise exit the gimbal. The Faraday cage also shields the interior from the entry of external EMI.

Given the inherent rotational characteristics of gimbals, it can be difficult and expensive to complete a Faraday cage volume across a gimbal bearing. The ball bearings that enable gimbals to rotate are generally made from steel having low electrical conductivity. In addition, lubricated single point bearing contacts between the inner and outer bearing races have extremely high electrical resistance values, indicating that they are poor conductors of electricity.

The general rotational dynamics of these sophisticated turrets, their increasingly complicated electronics, stronger torque motors, and varying materials all serve to increase the difficulties associated with containing and eliminating EMI. At the same time, continued development of enemy countermeasures necessitates further suppression of radiated EMI emissions.

SUMMARY OF THE INVENTION

The present invention provides bearing retainers with electrically conductive features that create an electrical path between the static and dynamic sides of a rotating joint and block EMI radiation from entering or leaving a given system. The retainers increase electrical conductivity across the dynamic bearing interfaces thereby closing an open Faraday cage volume. The retainers may be employed to greatly reduce EMI radiation emissions in systems having rotating gimbal interfaces with high resistance. An exemplary bearing retainer set in accordance with the invention includes outer and inner bearing retainers with an array of contact members therebetween. Contact members are mounted on the outer retainer to conduct current from an inner bearing race through the inner retainer, across the outer retainer to the outer bearing race, to a sink.

In the illustrated embodiment, concentric annular inner and outer bearing retainers are installed in contact with the inner and outer races of a dynamic bearing interface. Each contact member includes a base and tips. The outer bearing retainer ring has a recess for mounting a contact member and a slot for positioning the contact member tips to make contact with the inner bearing retainer ring. The inner bearing retainer ring includes a conductive contact surface. The contact member tips contact the conductive contact surface to create an electrical path to carry electrical signals through the dynamic bearing interface to appropriate grounding surfaces. This completes an open gimbal Faraday volume, which greatly reduces EMI radiation.

Various objects and advantages of this electrically conductive bearing retainer will become apparent from the following description taken in conjunction with the accompanying drawings wherein are set forth, by way of illustration and example, certain embodiments of this disclosure.

The drawings constitute a part of this specification, include exemplary embodiments of the disclosure, and illustrate various objects and features thereof.

DETAILED DESCRIPTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Electrically Conductive Dynamic Environmental Seal

Figure 1:
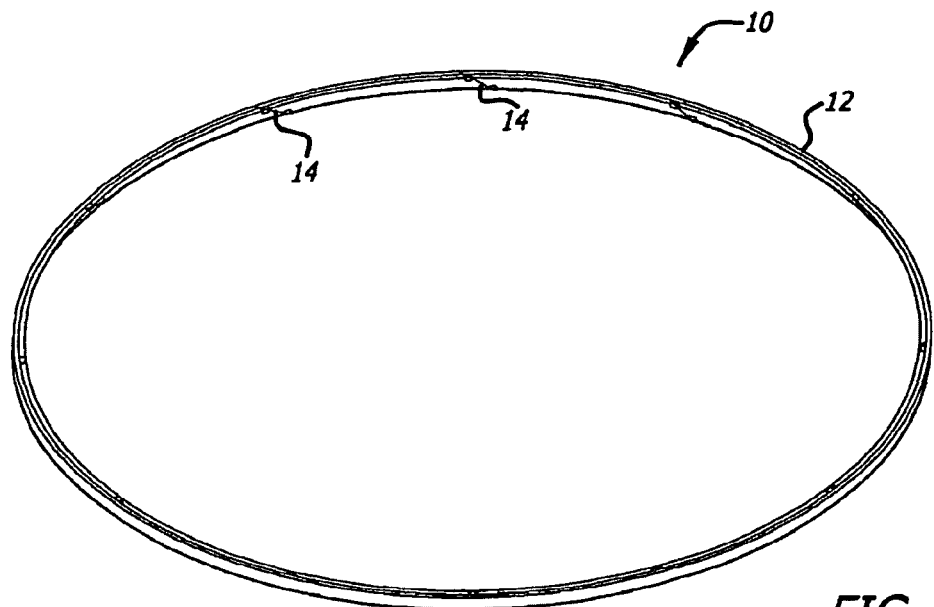
FIG. 1 is a perspective view of an electromagnetic and environmental seal implemented in accordance with the present teachings.
Figure 2:
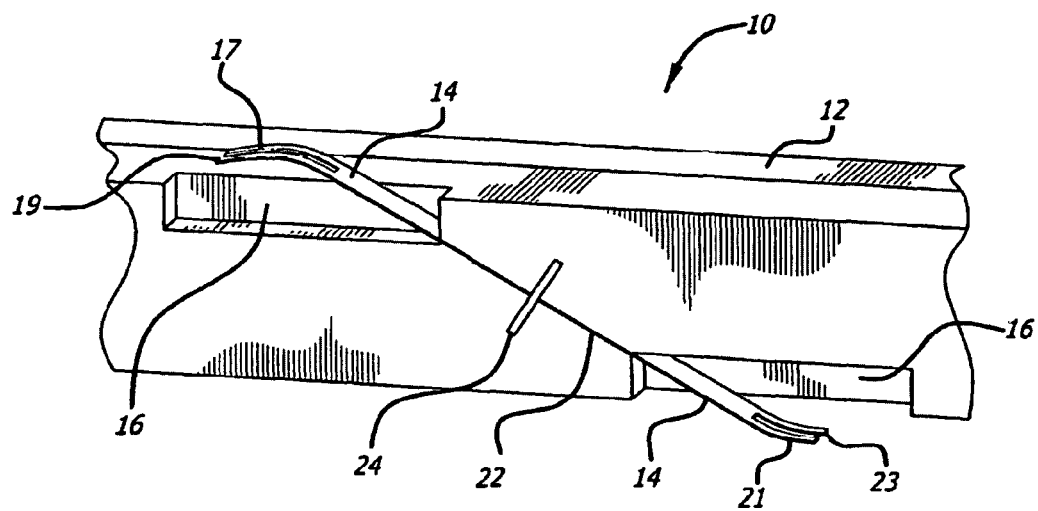
FIG. 2 is a magnified view of a portion of the inner periphery of the seal of FIG. 1.
Figure 3:
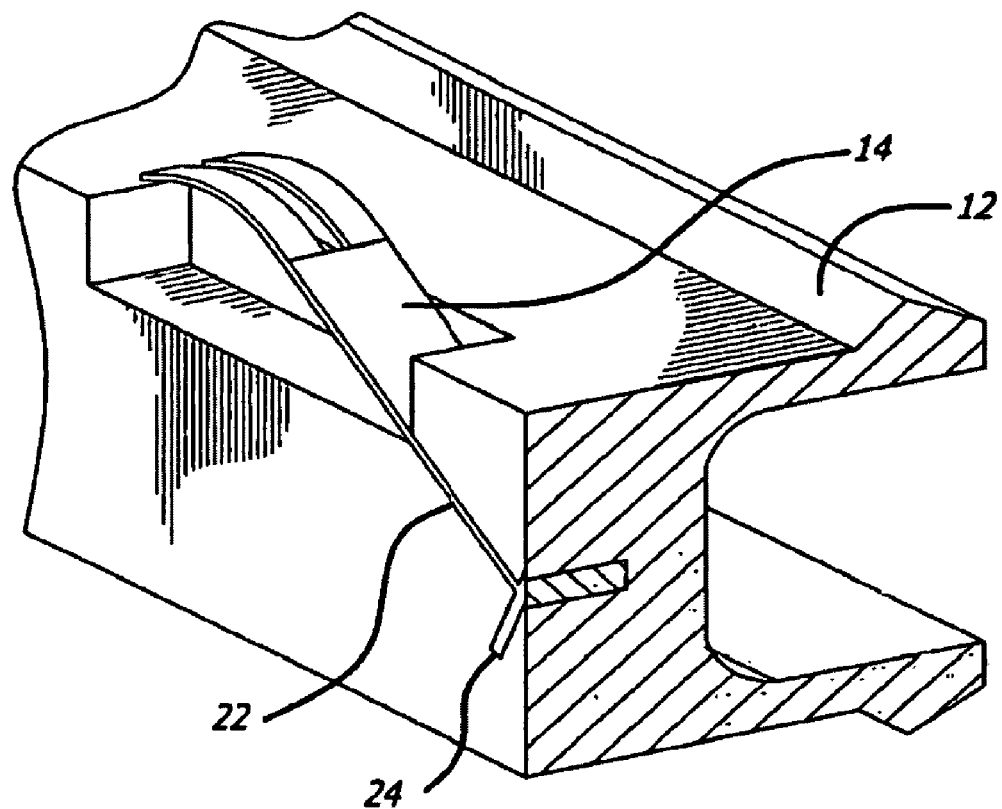
FIG. 3 is a perspective view sectional view of the seal of FIG. 1.

FIG. 1 is a perspective view of an electromagnetic and environmental seal implemented in accordance with the present teachings. FIG. 2 is a magnified view of a portion of the inner periphery of the seal of FIG. 1. FIG. 3 is a perspective view sectional view of the seal of FIG. 1.

As shown in FIGS. 1-3, the seal 10 includes an annular base 12 and a plurality of conductors 14 mounted therein to conduct current from a source disposed on a first side of the base to a sink disposed on a second side of the base. The seal shape may vary based on multiple factors including, but not limited to, physical size between two rotating sealing surfaces, desired seal location within an assembly, desired or undesired friction, allowable environmental contaminate leak rate, etc. The seal may be made from numerous electrically conductive and/or nonconductive materials including, but not limited to, graphite filled polytetraflouroethylene, fluorosilicone, rubber, etc. The seal may be spring reinforced with a conductive or non-conductive base material structure.

The conductive strips serve to greatly increase electrical conductivity between two rotating interfaces and provide a bridge to seal open Faraday cage volumes (such as in rotating gimbal components). In the illustrative embodiment, each conductor 14 is a single strip of conductive material and the base 12 has a recess therein 16, to allow for deflection thereof. The conductors may be made from any compliant electrically conductive material, e.g., gold, silver, nickel coated spring steel, etc. The number of conductors required is based on numerous considerations such as desired electrical conductivity between two rotating interfaces, desired or undesired surface friction, physical limits of size, EMI suppression requirements, EMI wavelength or frequency, etc. The conductors may be joined to the environmental seal via numerous fastening processes including, but not limited to, press fit, clamping, vulcanization, soldering, bonding, etc. The dimensions of the seal, the electrically conductive strips, and fingertips will vary depending on the requirements of the application.

Each conductive strip 14 may be split into multiple fingertips 17, 19,21,23 of varying quantity acting as a moving contact shown at each end thereof. Each strip 14 is secured at an angle in a slot 22 in the base and may be retained further by an anchor 24.

As mentioned above, one method to suppress system generated EMI is a Faraday cage. A Faraday cage is an enclosure designed to exclude electromagnetic fields in an application of one of Maxwell's equations: Gauss's law. Gauss's law describes the distribution of electrical charge on an electrically conductive form, such as a sphere, a plane, a torus, a gimbal etc. Since like charges repel each other, charge will 'migrate' to the surface of the conducting form. By adding a network of conductive contacts between rotating gimbal interfaces, a Faraday cage volume can be created.

Figure 4:
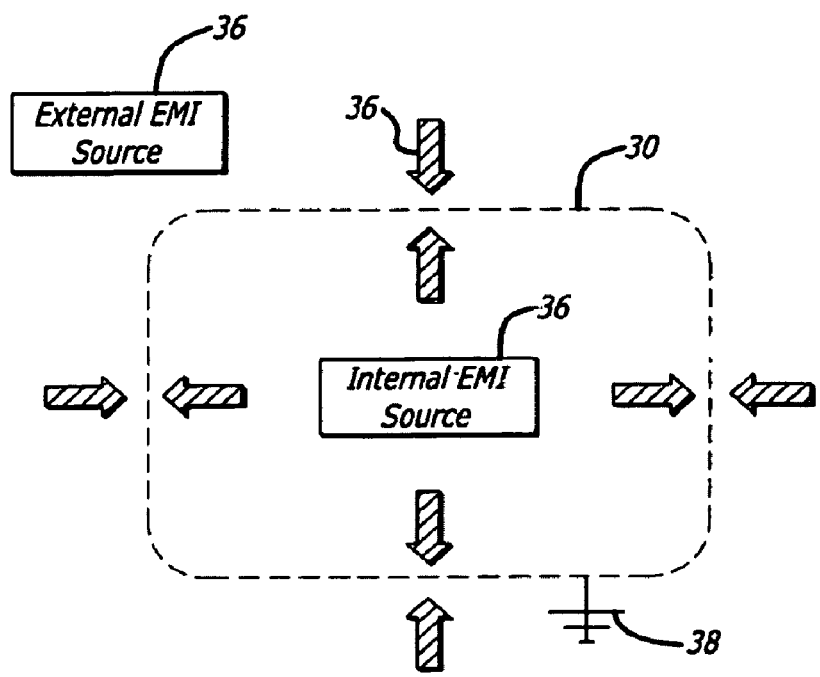
FIG. 4 is a simplified diagram of a theoretically ideal Faraday cage volume adapted to absorb EMI signals from internal and external sources.
Figure 5:
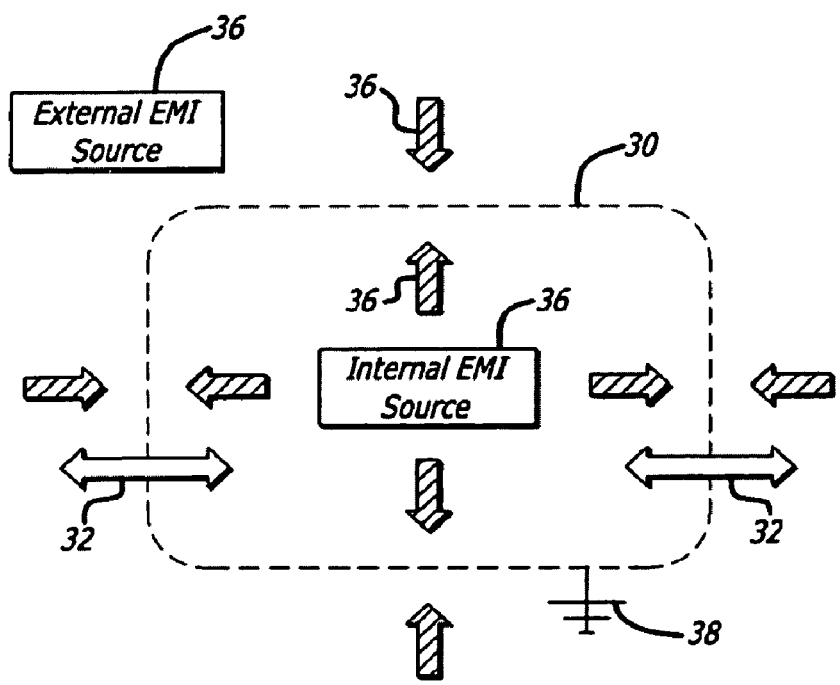
FIG. 5 is a simplified diagram of a Faraday cage volume with EMI transmissions due to poor joint conductivity.

FIG. 4 is a simplified diagram of a theoretically ideal Faraday cage volume adapted to absorb EMI signals and prohibit emissions. FIG. 5 is a simplified diagram of a Faraday cage volume with outgoing and incoming EMI emissions due to poor joint conductivity.

As illustrated in FIG. 4, as internally or externally generated EMI 36 approaches the theoretically ideal Faraday cage volume 30, charge will be absorbed and transferred back to chassis ground 38. This absorption eliminates EMI emissions from exiting or entering the gimbal.

Unfortunately, given the inherent rotational characteristics of gimbals, completing a Faraday cage volume can be difficult and expensive to accomplish. Ball bearings enable gimbals to rotate and they are generally made from low electrically conductive steel. In addition, lubricated single point bearing contacts between the inner and outer races have extremely high electrical resistance values. Electrical resistance "R", measured in Ohms n, is a physical material property that impedes electrical current flow. In other words, a material with a high electrical resistance value is considered a poor conductor of electricity. Conversely, a material with a low electrical resistance value is a good conductor of electricity.

In many turret systems, maximum electrical resistance values are strictly enforced by customer specifications. These values are measured from the inner sensor, through the gimbal (including bearings and seals), and eventually to chassis ground. In past systems, 1Ω to 4Ω was considered to be an acceptable maximum resistance value. Today resistance values of less than 2.5 milli-ohms are required to meet customer/program requirements. Such a change is a 1600 fold decrease in electrical resistance.

With increasingly complicated electronics, stronger torque motors, varying materials, and the general rotational dynamics of these sophisticated turrets, EMI becomes more difficult to contain and eliminate. In addition, as enemy countermeasures continue to develop, it is necessary to suppress these radiated and received EMI emissions even further than before.

In short, in practice, as depicted in FIG. 5, Faraday cage volumes 30 are opened/degraded due to rotating gimbal interfaces 32 via bearings and seals as a result of the low electrical conductivity thereof. The invention provides a low cost, easy to replace, highly electrically conductive, dynamic environmental seal that protects against environmental elements and bridges an open Faraday volume gap. This is illustrated in FIG. 6.

Figure 6:
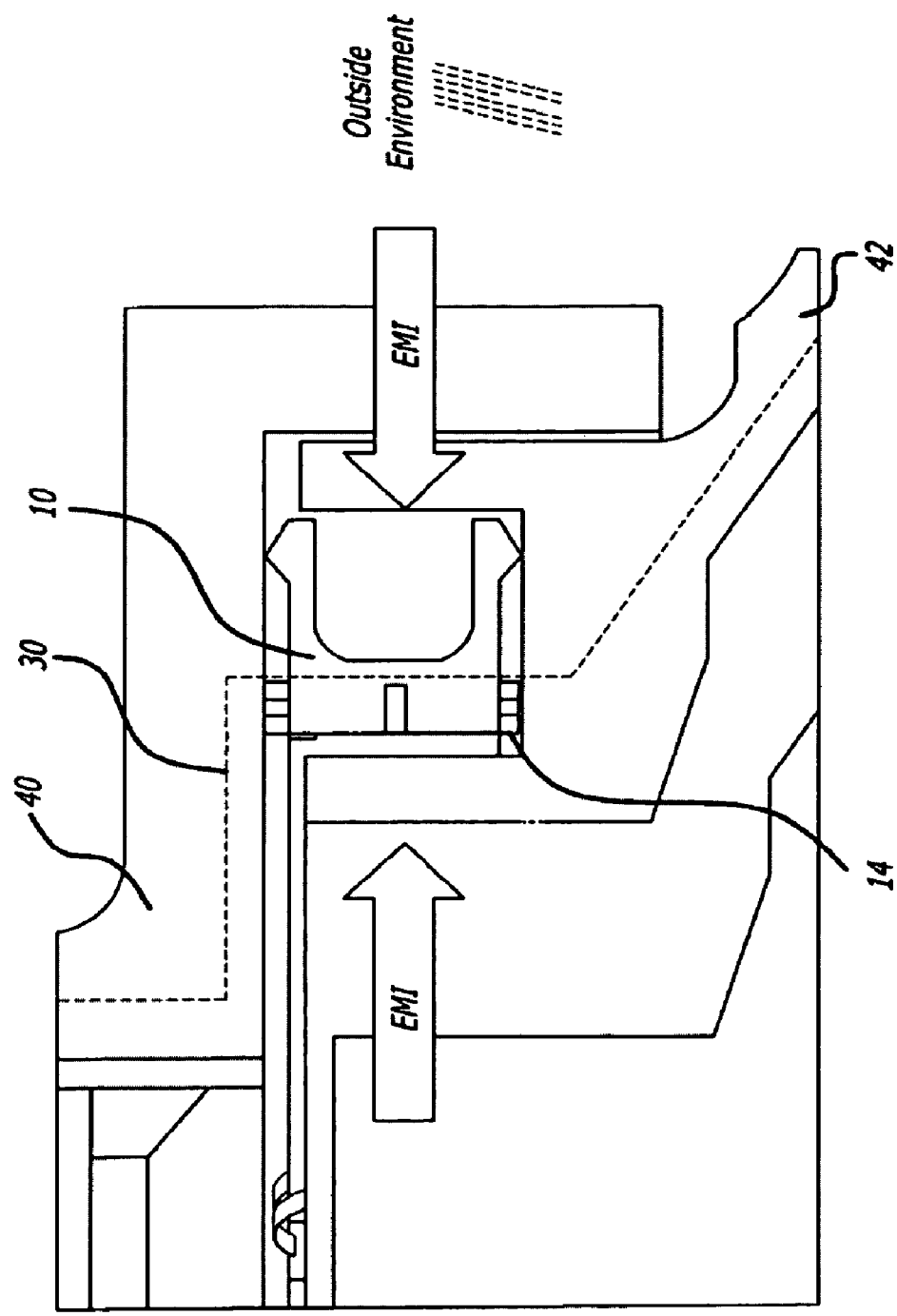
FIG. 6 is a sectional view of the inventive environmental and electrical seal in context in an illustrative application of the present teachings.

FIG. 6 is a sectional view of the inventive environmental and electrical seal in context in an illustrative application of the present teachings. As shown in FIG. 6, the highly conductive environmental seal 10 of the present invention is disposed between a static base component 40 and a dynamic rotating component such as the yoke of a gimbal 42. The conductive strips 14 ensure a good electrical connection between the static and dynamic components 40 and 42 effective to create a Faraday volume 30 with minimal EMI leakage and penetration. Hence, internally generated EMI or external EMI exposure is absorbed by electrical conductivity between components 40 and 42.

Hence, the inventive seal provides a novel method for creating a Faraday cage including the steps of 1) providing an electromagnetic and environmental seal comprising a ring adapted to provide an environmental seal and plural conductors mounted in the ring, each conductor being a conductive strip extending through the ring on first and second sides thereof and 2) mounting the seal in a rotary joint to provide electrical conductivity between two members connected by the joint and completing the Faraday volume.

These conductive seals may be used in multiple applications to increase electrical conductivity and suppress outgoing or incoming EMI emissions between static and dynamic sides of a rotating joint. The invention may be used in numerous civilian or military platforms. Examples of system use would include Electro Optical FLIR systems, gun turrets, missile turrets, laser turrets, sensor turrets, EMI sensitive equipment and other unspecified uses herein.

Electrically Conductive Bearing Retainers

Figure 7:
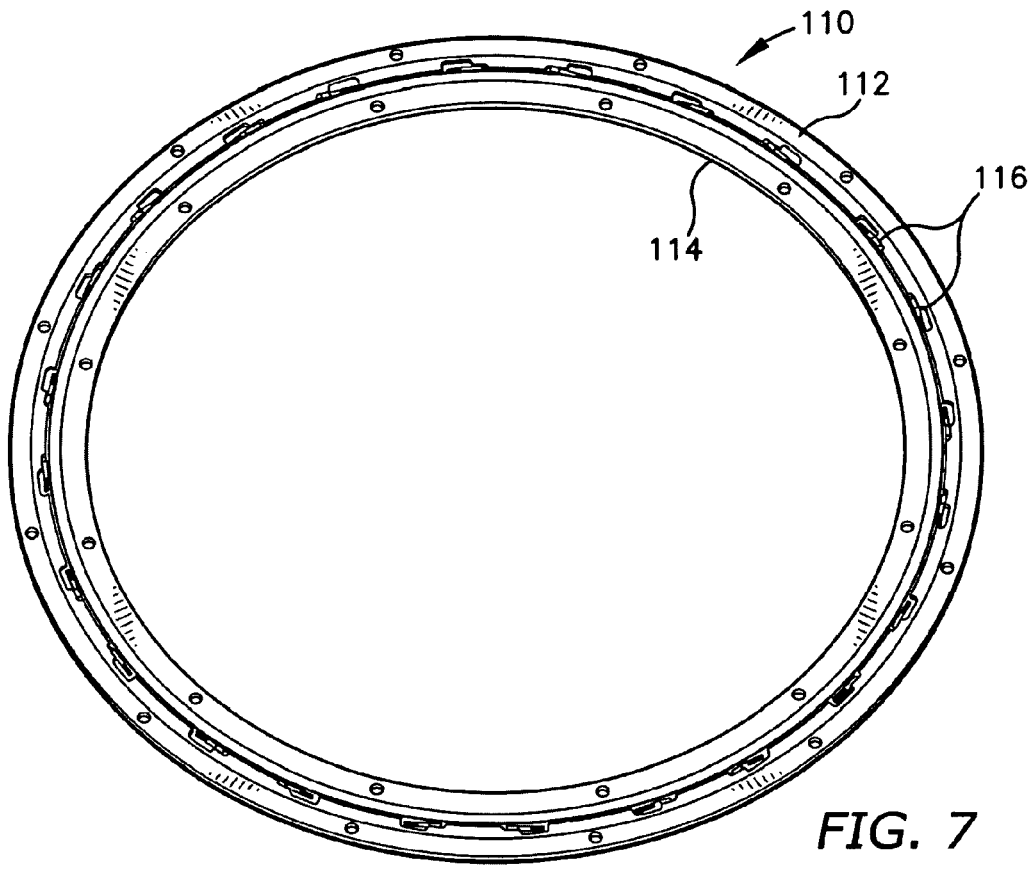
FIG. 7 is a perspective view of an embodiment of an electrically conductive bearing retainer set in accordance with the present teachings.
Figure 9:
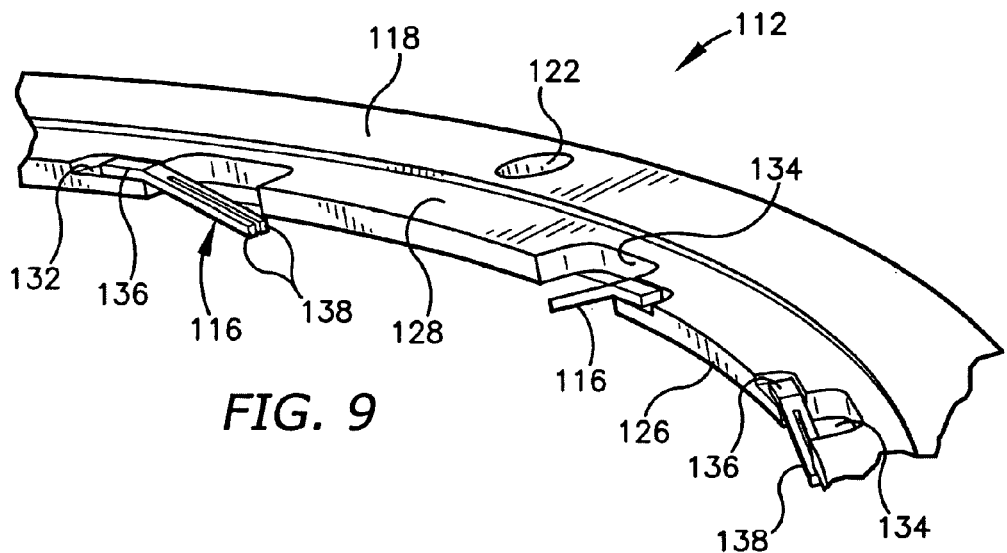
FIG. 9 is an enlarged perspective view of a portion of the outer bearing retainer showing attachment of the contact members.
Figure 10:
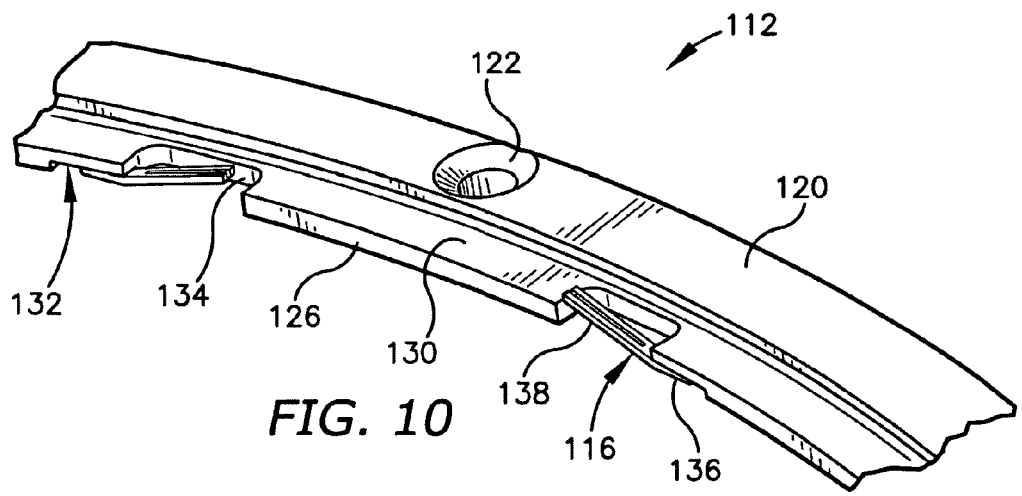
FIG. 10 is an enlarged inverted perspective view of a portion of the outer bearing retainer showing positioning of the contact members for contact of the contact member tips with the inner retainer.
Figure 11:
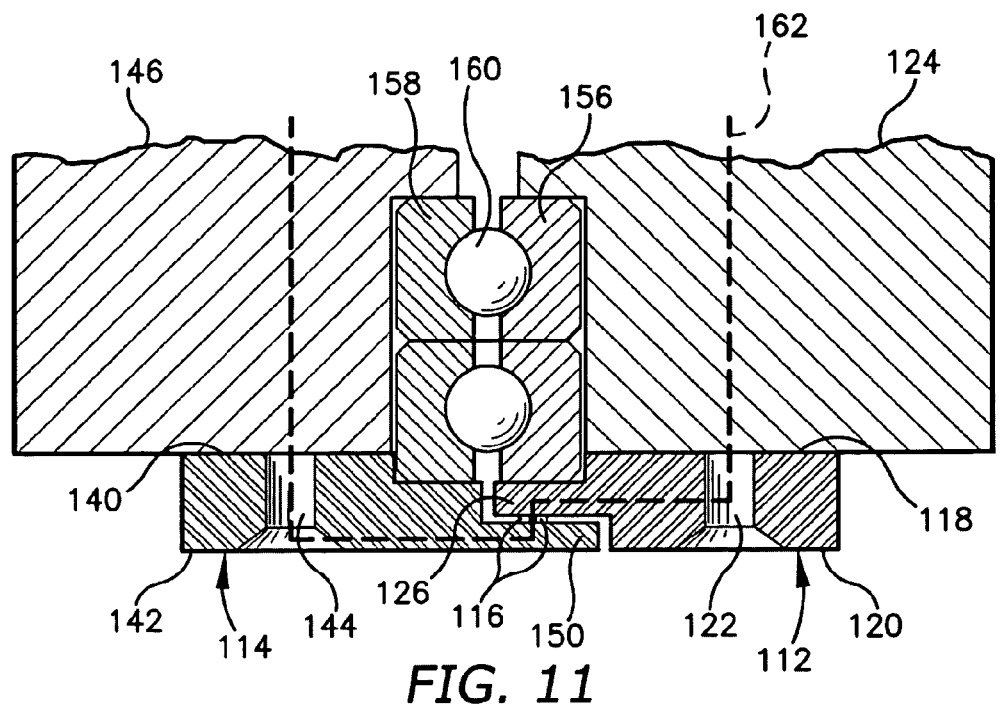
FIG. 11 is an enlarged radial cross section taken along line 11-11 of FIG. 8 with bearing races and additional structure illustrated and showing a diagrammatic representation of a Faraday cage.

FIGS. 7-12 illustrate an embodiment of an electrically conductive bearing race retainer set constructed in accordance with the present invention. As shown in FIG. 7, the reference numeral 110 refers to a bearing retainer set having a pair of concentric annular outer and inner retainer rings, 112 and 114 with a plurality of electrically conductive contact members 116 for creating an electrical path across the dynamic bearing interfaces. In the illustrated embodiment, the outer bearing retainer 112 is fixed against rotation or static and includes a bearing mounting surface 118 (FIG. 9) and a reverse surface 120, shown in the inverted view of the outer retainer 112 in FIG. 10. The reverse surface 120 has a plurality of circumferentially spaced countersunk apertures 122 for receiving fasteners (not shown) for mounting attachment of the outer retainer 112 to a static body or element 124 (FIG. 11).

Figure 12:
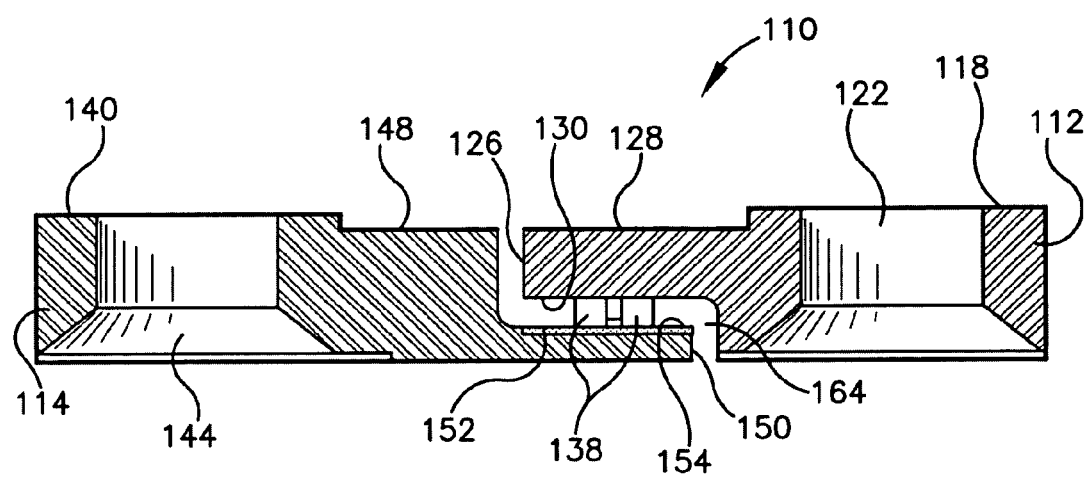
FIG. 12 is a further enlarged sectional view similar to FIG. 11 and illustrating a conductive contact surface engaged by the contact members.

As shown in FIGS. 11 and 12, the outer bearing retainer 112 is stepped radially inward on both surfaces 118 and 120 to form a contact member support flange 126. On the bearing side, the flange 126 forms an outer bearing race engaging channel 128. On the reverse side, the support flange 126 forms a relief surface 130 to accommodate overlap of the inner bearing retainer 114.

The channel 128 includes a plurality of circumferentially spaced recesses 132 with adjacent apertures, slots or notches 134 for mounting an array of electrically conductive strips or contact members 116 on the outer retainer 112 (FIGS. 9, 10). The contact members 116 may be constructed from any suitable resilient high conductivity metal having adequate wear properties, such as, for example, spring steel. They may be plated with gold or other noble metal such as platinum, iridium, osmium, palladium, rhodium, or ruthenium, to increase electrical conductivity. The preferred number and size of the contact members 116 may vary with the circumstances of intended usage, such as, for example, desired electrical conductivity across the inner and outer retainers 114 and 112, EMI suppression requirements, EMI wavelength or frequency, surface friction, and available physical space.

Each contact member 116 includes a mounting base 136 connected to a contact member tip or tips 138. While the contact members in the embodiment illustrated in FIGS. 7-12 are each split into a pair of tips or fingers 138, it is foreseen that the contact members may be constructed to have any suitable number of tips 138. The contact member bases 136 are attached to the outer retainer 112 by mounting in respective recesses 132 as by soldering, bonding, welding, screwing, riveting, clamping, or otherwise fixedly attaching the base 136 to the flange 126 within the recess 132. The contact members 116 are oriented circumferentially about the retainer ring 112 with the tips aligned in alternating clockwise or counterclockwise relation as shown in FIG. 7, and may also be aligned in pairs with all of the tips 138 in clockwise or counterclockwise relation, or in any permutation or combination thereof. The notches 134 extend through the full thickness of the outer flange 126 and the contact members 116 are positioned so that the tips 138 will make contact with the inner bearing retainer 114. The contact member tips 138 and the base 136 generally subtend an angle, so that when the bases 136 are mounted in the recesses 133, the tips 138 extend into and through the adjacent slots 134 to a contacting position approximately tangential to the inner bearing retainer 114.

The inner bearing retainer 114 is rotary or dynamic component of the retainer set 110 and includes an inner bearing mounting surface 140 (FIG. 8) and a reverse surface 142 (FIG. 11). Like the reverse surface 120 of the outer retainer 112, the reverse surface 142 of the inner retainer 114 has a plurality of circumferentially spaced countersunk apertures 144 for receiving fasteners (not shown) for mounting attachment of the inner retainer 114 to a dynamic body or element 146.

As best shown in FIGS. 11 and 12, the inner bearing retainer 114 is double stepped radially inward on the inner bearing mounting surface 140 to form an inner bearing race engaging channel portion 148 and a contact layer support flange 150 for overlapping the contact member support flange 126 of the outer bearing retainer 112. The bearing side of the contact layer support flange 150 includes a conductive contact layer 152 (FIG. 12). The contact layer 152 has a flat, conductive contact surface 154 to accommodate contact by the tips 138 of a contact member 116. The contact surface 154 is roughly finished, and may be plated with gold or another noble metal to improve conductivity and to minimize the generation of particulates caused by wear against the contact member tips 138.

The bearing retainers 112 and 114 are sized for the requirements of the application and are constructed of any suitable electrically conductive material. The choice of material may be influenced by a variety of factors, such as, for example, preferred electrical conductivity, bearing materials, bearing pre-load requirements, weight and thermal requirements. Those skilled in the art will appreciate that, while the illustrated embodiment shows a static outer bearing retainer 112 and dynamic inner bearing retainer 114, the retainer set may be constructed to include a dynamic outer bearing retainer and static inner retainer, or it is foreseen that both bearing retainers could be mounted for relative rotation.

In use, a Faraday cage or shield is created across a dynamic interface such as a bearing by installing the bearing retainers 112 and 114 in contact with the outer and inner bearing supports or races 156 and 158 of the bearing interface. The inner and outer bearing races 156 and 158 may be stacked to form multiple layers of bearing races. Two layers of bearing races 156 and 158 are shown in the embodiment illustrated in FIG. 11. The outer and inner retainers 112 and 114 are fastened via the apertures 122 and 144 to respective static and dynamic elements 124 and 146 so that the outer and inner race channels 128 and 148 each contact a respective outer or inner bearing race 156 or 158 and cooperatively form a bearing race channel for supporting them. The outer and inner bearing races 156 and 158 together make up a raceway for rotation of a plurality of ball bearings 160 (FIG. 11). The contact member support flange 126 of the outer bearing retainer 112 overlaps the contact layer support flange 150 of the inner bearing retainer 114 so that the conductive contact members 116, which are each attached at their base 136 to a respective recess 132 on the outer retainer 112, extend through a respective notch 134 to engage the conductive contact surface 154 of the inner bearing retainer 114.

Figure 8:
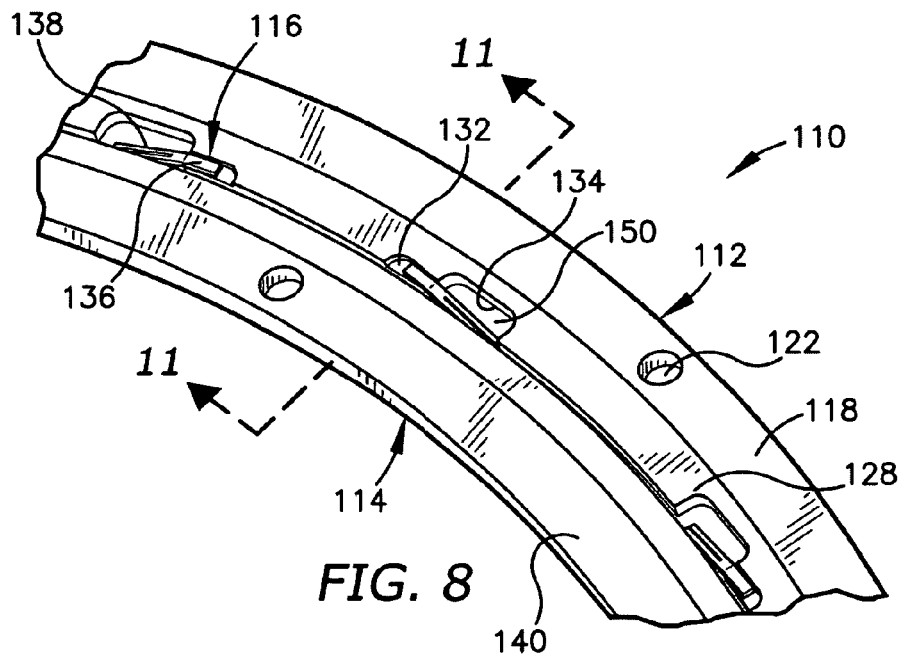
FIG. 8 is an enlarged perspective view of a portion of the bearing retainer set showing the contact members compressed between the inner and outer bearing retainers.

As best shown in FIGS. 8 and 12, the electrically conductive contact members 116 conform and compress into the contact surface 154 of the inner bearing retainer 114, with the contact member support flange 126 overlapped by the contact layer support flange 150 so that the contact members 116 rub against the contact surface 154 as the inner bearing retainer 114 rotates. This contact creates an electrical or Faraday path 162 (FIG. 11) to carry electrical signals through the dynamic bearing interfaces to a common conductor, chassis grounding surface or sink to thereby prevent propagation of such signals through a gap 164 between the static and dynamic bearing retainers 112 and 114. The Faraday cage thus created is shown in idealized form in FIG. 4. A diagrammatic representation of the path 162 of the cage is shown in FIG. 11.

In this manner, the conductive bearing retainer set 110 may be used to increase electrical conductivity between the static and dynamic sides of a rotating joint and to form a Faraday cage volume that blocks EMI radiation from entering or leaving a given system. The retainer set 110 may be used in a wide variety of military and commercial systems, including electro-optical FLIR systems, gun and missile turrets, laser and sensor turrets and any EMI sensitive equipment.

EXAMPLE 1

Electrical conductivity tests were conducted using AN/ZSQ-2 electro-optical sensor systems for navigation, surveillance and targeting (manufactured by Raytheon, Inc.). Systems equipped with bearing retainers having the electrically conductive contact members described herein were compared with systems lacking the electrically conductive contact members described herein. Systems having a single dynamic interface (azimuth bearing) and systems having two dynamic interfaces (azimuth and elevation bearings) were tested. The electrical resistances of each system was measured and are summarized in the Table 1.

| Number of Interfaces | Bearing Retainers With No Contact Members | Bearing Retainers With Electrically Conductive Contact Members |
| --- | --- | --- |
| One Dynamic Interface (AZ Bearing) | 43-45 milli Ω | 4.5-4.7 milli Ω |
| Two Dynamic Interfaces (AZ and EL Bearings) | 80-82 milli Ω | 9.6-9.7 milli Ω |

In systems having a single azimuth dynamic bearing interface equipped with bearing retainers with electrically conductive contact members, conductivity was reduced to 10.46%-10.44% of the conductivity of similar systems not equipped with electrically conductive contact members. In systems having both azimuth and elevation dynamic bearing interface equipped with bearing retainers with electrically conductive contact members, conductivity was reduced to 12%-11.83% of the conductivity of similar systems not equipped with electrically conductive contact members.

It is to be understood that while certain forms of the electrically conductive bearing retainers have been illustrated and described herein, the invention is not to be limited to the specific forms or arrangement of parts described and shown.

The invention claimed is:

1. An electrically conductive bearing retainer set arranged at a rotating joint of a system, comprising:
    a conductive outer bearing retainer arranged at an outer portion of the rotating joint;
    a conductive inner bearing retainer arranged at an inner portion of the rotating joint;
    a plurality of conductive contact members; and
    each of said contact members being connected to one of said outer retainer and said inner retainer in circumferentially spaced relation and contacting said retainers for thereby forming an electrical path therebetween between static and dynamic sides of the rotating joint to block electromagnetic radiation from entering or leaving the system;
    wherein the each contact member includes a base connected with a tip.

2. The electrically conductive bearing retainer set as set forth in claim 1, wherein:
said inner bearing retainer is rotatable relative to said outer bearing retainer.

3. The electrically conductive bearing retainer set as set forth in claim 1, wherein:
said contact members are connected to said inner bearing retainer and contact said outer retainer; and
said outer bearing retainer is rotatable.

4. The electrically conductive bearing retainer as set forth in claim 1, wherein:
said inner bearing retainer is fixed in place.

5. The electrically conductive bearing retainer set as set forth in claim 1, wherein each contact member is plated with a noble metal selected from the group consisting essentially of gold, platinum, iridium, osmium, palladium, rhodium and ruthenium.

6. The electrically conductive bearing retainer set as set forth in claim 1, wherein:
said outer bearing retainer includes a plurality of notches, each notch having one of said contact member tips extending therethrough.

7. The electrically conductive bearing retainer set as set forth in claim 6, wherein:
said outer bearing retainer includes a plurality of recesses adjacent said notches, each recess receiving the base of the contact member.

8. The electrically conductive bearing retainer set as set forth in claim 1, wherein:
selected ones of said tips of the contact members extend in a clockwise direction relative to said retainer set; and
selected ones of said tips of the contact members extend in a counterclockwise direction relative to said retainer set.

9. The electrically conductive bearing retainer set as set forth in claim 1, wherein:
said inner bearing retainer includes a conductive contact surface positioned for contact by said tips of the contact members.

10. The electrically conductive bearing retainer set as set forth in claim 1 wherein said retainer set has an annular configuration.

11. An electrically conductive bearing retainer set arranged at a rotating joint of a system between a fixed element and a rotating element, comprising:
an annular outer bearing retainer connected to the fixed element;
an annular inner bearing retainer connected to the rotating element;
a plurality of contact members circumferentially connected to said outer bearing retainer in circumferentially spaced relation and contacting said inner bearing retainer;
said contact members each having a base connected with a tip;
said inner bearing retainer having a conductive contact surface; and
said outer bearing retainer having a plurality of notches, each notch adapted for receiving a portion of one of said contact members therethrough for enabling said contact member tip to contact said conductive contact surface so as to form an electrical path between the fixed element and the rotating element of the rotating joint to block electromagnetic radiation from entering or leaving the system.

12. A rotary shield to prevent propagation of radiant electromagnetic energy through the shield and comprising:
a conductive stationary element;
a conductive rotatable element;
an annular conductive stationary bearing race support secured to said stationary element;
an annular conductive rotatable bearing race support secured to said rotatable element;
a plurality of bearing races engaged between said stationary and rotatable bearing race supports for circumferential rotation within said annular bearing races;
a plurality of bearings engaged between said bearing races;
an electrically conductive surface secured to one of said bearing race supports;
a plurality of contact members secured to the other of said bearing race supports in circumferentially spaced relation; and
said contact members and said electrically conductive surface cooperating to provide electrical continuity between said stationary and rotatable elements.

13. The rotary shield as set forth in claim 12, wherein:
said rotary shield further comprises a dynamic Faraday cage.

14. The rotary shield as set forth in claim 12, wherein:
said plurality of contact members is sufficient to provide electromagnetic shielding to prevent radiation of electromagnetic energy through said shield.

15. The rotary shield as set forth in claim 12, wherein each of said contact members includes a base and a tip.

16. The rotary shield as set forth in claim 15, wherein said tips are arranged in clockwise relation to said annular bearing race supports.

17. The rotary shield as set forth in claim 15, wherein said tips of the contact members are arranged in counterclockwise relation to said annular bearing race supports.

18. The rotary shield as set forth in claim 15, wherein:
selected ones of said tips of the contact members extend in clockwise relation to said annular bearing race supports; and
alternate ones of said tips of the contact members extend in counterclockwise relation to said annular bearing race supports.

19. The rotary shield as set forth in claim 12, wherein said one of said bearing race supports overlaps said other bearing race support for enabling said conductive member to contact said electrically conductive surface.

* * * * *